United States Patent
Schwandner

(10) Patent No.: US 9,224,613 B2
(45) Date of Patent: Dec. 29, 2015

(54) METHOD FOR POLISHING BOTH SIDES OF A SEMICONDUCTOR WAFER

(75) Inventor: Juergen Schwandner, Garching (DE)

(73) Assignee: SILTRONIC AG, Munich (DE)

( * ) Notice: Subject to any disclaimer, the term of this patent is extended or adjusted under 35 U.S.C. 154(b) by 1387 days.

(21) Appl. No.: 12/582,788

(22) Filed: Oct. 21, 2009

(65) Prior Publication Data

US 2010/0104806 A1  Apr. 29, 2010

(30) Foreign Application Priority Data

Oct. 29, 2008 (DE) .......................... 10 2008 053 610

(51) Int. Cl.
| | |
|---|---|
| H01L 21/302 | (2006.01) |
| H01L 21/461 | (2006.01) |
| H01L 21/311 | (2006.01) |
| B44C 1/22 | (2006.01) |
| H01L 21/304 | (2006.01) |
| B24B 37/04 | (2012.01) |
| B24B 37/08 | (2012.01) |

(52) U.S. Cl.
CPC ............ *H01L 21/304* (2013.01); *B24B 37/042* (2013.01); *B24B 37/08* (2013.01); *H01L 21/461* (2013.01); *Y10T 428/24355* (2015.01)

(58) Field of Classification Search
None
See application file for complete search history.

(56) References Cited

U.S. PATENT DOCUMENTS

| | | | |
|---|---|---|---|
| 5,860,848 A * | 1/1999 | Loncki et al. .................... 451/36 |
| 6,080,673 A | 6/2000 | Ko et al. | |
| 6,290,580 B1 * | 9/2001 | Tanaka et al. .................... 451/44 |
| 2001/0039101 A1* | 11/2001 | Wenski ........................ 438/471 |
| 2002/0069967 A1 | 6/2002 | Wright | |
| 2003/0022495 A1* | 1/2003 | Netsu et al. .................... 438/689 |
| 2004/0266181 A1 | 12/2004 | Schauer et al. | |
| 2005/0227590 A1* | 10/2005 | Sung ................................ 451/41 |
| 2006/0097355 A1 | 5/2006 | Bauer et al. | |
| 2006/0246724 A1 | 11/2006 | Takamatsu | |
| 2006/0258268 A1 | 11/2006 | Miyata et al. | |
| 2009/0029552 A1 | 1/2009 | Schwandner et al. | |

FOREIGN PATENT DOCUMENTS

| | | |
|---|---|---|
| DE | 102004054566 A1 | 5/2006 |
| DE | 102007035266 A1 | 1/2009 |
| EP | 1050369 A1 | 8/2000 |
| EP | 1261020 A1 | 11/2002 |

(Continued)

*Primary Examiner* — Stephanie Duclair
(74) *Attorney, Agent, or Firm* — Brooks Kushman P.C.

(57) ABSTRACT

Both sides of a large diameter semiconductor wafer are polished by the following ordered steps:
a) polishing the wafer backside on a polishing pad containing a fixed abrasive, a polishing agent solution free of solids being introduced between the wafer backside and the polishing pad;
b) stock polishing the wafer frontside on a polishing pad which contains a fixed abrasive, a polishing agent solution free of solids being introduced between the wafer frontside of and the polishing pad;
c) removing microroughness and microdamage from the wafer frontside by polishing the frontside on a polishing pad, a polishing agent solution containing abrasives being introduced between the wafer frontside and the polishing pad; and
d) final polishing of the wafer frontside by polishing the frontside on a polishing pad containing no fixed abrasive, a polishing agent solution containing abrasives being introduced between the wafer frontside and the polishing pad during the polishing step.

16 Claims, 1 Drawing Sheet

(56) References Cited

FOREIGN PATENT DOCUMENTS

| | | |
|---|---|---|
| EP | 1717001 A1 | 11/2006 |
| JP | 09-232257 A | 5/1997 |
| JP | 2001-135605 A | 5/2001 |
| JP | 2002-134581 A | 5/2002 |
| JP | 2002-512894 A | 5/2002 |
| JP | 2002-252189 A | 6/2002 |
| JP | 2002-231669 A | 8/2002 |
| JP | 2004512970 A | 4/2004 |
| JP | 2007053119 A | 1/2007 |
| JP | 2008218885 A | 9/2008 |
| JP | 2008221416 A | 9/2008 |
| WO | 9213680 | 8/1992 |
| WO | 99/55491 A1 | 11/1999 |
| WO | 9955491 | 11/1999 |
| WO | 03074228 A1 | 9/2003 |
| WO | 2005010966 A1 | 2/2005 |

\* cited by examiner

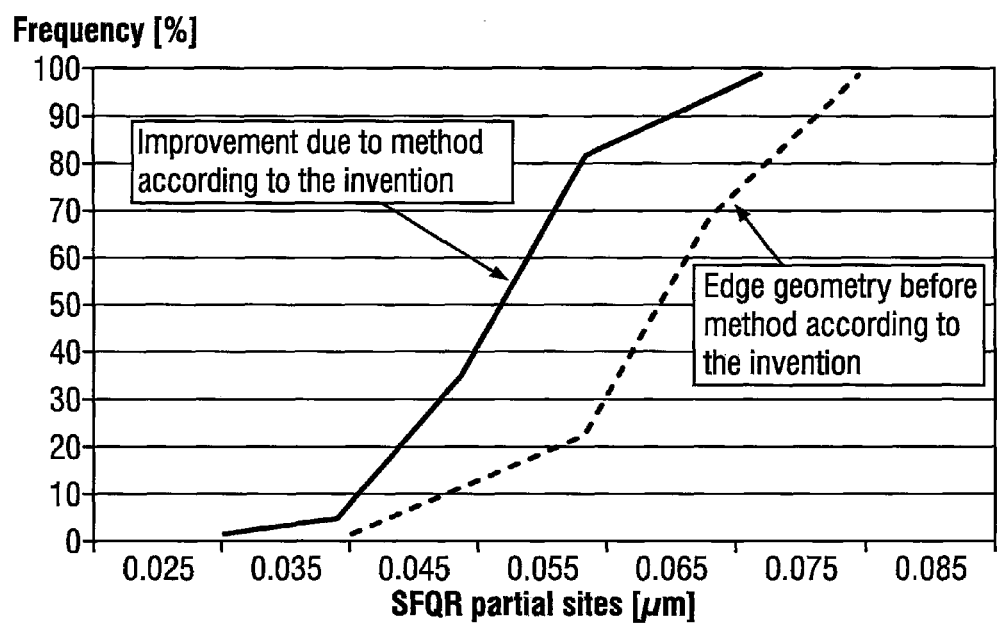

METHOD FOR POLISHING BOTH SIDES OF A SEMICONDUCTOR WAFER

CROSS-REFERENCE TO RELATED APPLICATIONS

This application claims priority to German Application DE 10 2008 053 610.5 filed Oct. 29, 2008, which is herein incorporated by reference.

BACKGROUND OF THE INVENTION

1. Field of the Invention

The invention relates to a method for polishing both sides of a semiconductor wafer, in particular, for polishing silicon wafers of the next technology generations, primarily wafers which have a diameter of 450 mm.

2. Background Art

At present, polished or epitaxially processed semiconductor wafers with a diameter of 300 mm are used for the most demanding applications in the electronics industry. Silicon wafers with diameters of 200 mm are gradually being replaced by 300 mm wafers.

An essential reason why the electronics industry desires larger substrates for the production of their components, whether microprocessors or memory chips, resides in the enormous economic advantage which they promise. In the semiconductor industry it has for a long time been customary to focus on the available substrate area, or in other words to consider how great a number of components, i.e. logic chips or memory chips, can be accommodated on an individual substrate. This is related to the fact that a multiplicity of the component manufacturer's processing steps are aimed at the entire substrate, but there are also the individual steps for structuring the substrates i.e. producing the component structures which subsequently lead to the individual chips, and therefore the production costs for both groups of processing steps are very particularly determined by the substrate size. The substrate size influences the production costs per component to a very considerable extent, and is therefore of immense economic importance.

However increasing the substrate diameter entails great and sometimes entirely new, hitherto unknown technical problems. All the processing steps, whether they are purely mechanical (sawing, grinding, lapping), chemical (etching, cleaning) or chemical-mechanical in nature (polishing) as well as the thermal processes (epitaxy, annealing), require thorough revision, in particular with respect to the machines and systems (equipment) used for them.

WO 99/55491 A1 describes a two-stage polishing method with a first "fixed abrasive polishing" ("FAP") polishing step and a subsequent second CMP polishing step. For CMP, the polishing pad does not contain fixed abrasive. As in a double-sided polishing ("DSP") step, abrasive is introduced here in the form of a suspension between the semiconductor wafer and the polishing pad. Such a two-stage polishing method is used, in particular, to remove scratches which the FAP step has left behind on the polished surface of the substrate.

EP 1 717 001 A1 is an example of FAP steps also being used for the polishing of semiconductor wafers, on whose surface component structures have not yet been formed. The polishing of such semiconductor wafers is primarily aimed at producing at least one side surface which is particularly flat, and which has the smallest possible microroughness and nanotopography.

US 2002/00609967 A1 relates to CMP methods for planarizing topographical surfaces during the production of electronic components. The primary aim is to alleviate the disadvantage of comparatively low removal rates when using FAP polishing pads. A sequence of polishing steps is proposed, in which polishing is carried out first with an FAP pad in combination with a polishing agent suspension and subsequently with an FAP pad in conjunction with a polishing agent solution. The sequence of steps is deliberately selected in order to increase the removal rate. The polishing of wafers made of a material with a homogeneous composition, for example silicon wafers, is not disclosed therein.

Likewise, WO 03/074228 A1 also discloses a method for planarizing topographical surfaces during the production of electronic components. Here, the focus of the invention resides in the endpoint detection of the CMP method. As is known, endpoint detection involves ending the polishing and therefore the material removal promptly before it causes the removal of regions which are not in fact intended to be polished. To this end, a two-stage method is proposed for polishing a copper layer. In the first step polishing is carried out with an FAP polishing pad, in which case the polishing agent optionally may or may not contain free abrasive particles. In the second polishing step however, in which polishing is likewise carried out with an FAP pad, the use of a polishing agent with free abrasive particles is essential.

Unpublished German Patent Application 102 007 035 266, describes a method for polishing a substrate made of semiconductor material, comprising two polishing steps of the FAP type which differ from one another in that a polishing agent suspension containing fixed abrasive as a solid substance is introduced between the substrate and the polishing pad in one polishing step, while in the second polishing step the polishing agent suspension is replaced by a polishing agent solution which is free of solids.

All the methods known in the prior art have a crucial disadvantage with respect to stock polishing, which includes conventional double-sided polishing methods and the FAP polishing method. Both sides of the semiconductor wafer are polished simultaneously, which leads to an unfavorable edge geometry, in conventional double-sided polishing a so-called "edge roll-off" i.e. an edge reduction relative to the thickness of the semiconductor wafer. Experiments have shown that this problem is even further exacerbated when polishing wafers with larger diameters, i.e. for example the aforementioned wafers with a 450 mm diameter. The larger substrates entail an increase in the differential polishing removal at the wafer edge and in the remaining region of the wafer, so that edge roll-off is even more pronounced.

This is problematic in particular owing to the fact that according to the internationally agreed so-called Roadmap (ITRS, "International Technology Roadmap for Semiconductors", chapter "Front End Processes"), the manufacturers of semiconductor wafers are required to increase the area of the wafers which can be used for producing components and reduce the so-called "edge exclusion" which is not available for components.

While an edge exclusion of 2 mm is currently considered to be acceptable, initially this size will become more difficult to achieve in future years owing to the increase in the wafer diameter to 450 mm, and subsequently it will even be reduced to 1 mm. This will only be accomplished by significantly reducing the edge roll-off. It would be desirable to eliminate edge roll-off entirely.

Another characteristic, which is subject to ever more stringent requirements according to the ITRS Roadmap, is the nanotopography of the semiconductor wafer. The nanotopography is conventionally expressed as a height variation PV (="peak to valley"), based on square measurement windows with an area of 2 mm×2 mm. Here again, it was found long ago that the previous polishing methods are not sufficient to satisfy the increased requirements of larger semiconductor wafers.

Lastly, besides the edge geometry and the nanotopography, the global and local planarities are also of crucial importance for making the next and subsequent technology generations possible. One particularly critical property is the local planarity or local geometry of the semiconductor wafer on its frontside. Modern stepper technology demands optimal local planarities in subregions of the frontside of the semiconductor wafer, expressed for example as SFQR ("site front-surface referenced least squares/range"=magnitude of the positive and negative deviations from a frontside, defined by least squares minimization, for a component surface (measurement window, "site") of defined dimension). The maximum local planarity value $SFQR_{max}$ indicates the highest SFQR value for the component surfaces taken into account on a semiconductor wafer.

The maximum local planarity value is conventionally determined by taking an edge exclusion of 2 mm into account. An area on a semiconductor wafer inside a nominal edge exclusion is conventionally referred to as "fixed quality area", abbreviated to FQA. Those sites which lie with a part of their area outside the FQA, but whose centers lie inside the FQA, are referred to as "partial sites".

A generally acknowledged rule of thumb states that the $SFQR_{max}$ value of a semiconductor wafer must be equal to or less than the line width possible on this semiconductor wafer for semiconductor components to be produced on it. Exceeding this value leads to focusing problems for the stepper, and therefore to loss of the relevant component.

Currently, the semiconductor wafers available on the market correspond to the 45 nm technology generation (line width=45 nm) which is gradually being replaced by the already developed 32 nm technology, and to this extent the component manufacturers are also gradually changing their device processes accordingly. The 22 nm technology generation, which will follow this, is already in development. It has been found that the conventional polishing methods are indeed not sufficient for satisfying the requirements of the 22 nm design rule.

SUMMARY OF THE INVENTION

The present invention focuses on the polishing of a semiconductor wafer as the last essential processing step when the wafer is intended for the production of memory chips, or in principle as the penultimate essential processing step which precedes epitaxy of the semiconductor wafer, when the wafer is intended to be used as a so-called epi wafer for the production of microprocessors. It is an object of the present invention to provide a new polishing method which both satisfies the requirements of future technology generations and is suitable for the new generation of 450 mm wafers.

These and other objects are achieved by a method for polishing both sides of a semiconductor wafer, comprising the following steps in the order specified:

a) polishing of a backside of the semiconductor wafer on a polishing pad which contains an abrasive fixed in the polishing pad, a polishing agent solution which is free of solids being introduced between the backside of the semiconductor wafer and the polishing pad during the polishing step;

b) stock polishing of the frontside of the semiconductor wafer on a polishing pad which contains an abrasive fixed in the polishing pad, a polishing agent solution which is free of solids being introduced between the frontside of the semiconductor wafer and the polishing pad during the polishing step;

c) removal of the microroughness and microdamage from the frontside of the semiconductor wafer by polishing the frontside of the semiconductor wafer on a polishing pad, a polishing agent solution which contains abrasives being introduced between the frontside of the semiconductor wafer and the polishing pad during the polishing step;

d) finish polishing of the frontside of the semiconductor wafer by polishing the frontside of the semiconductor wafer on a polishing pad which contains no abrasive fixed in the polishing pad, a polishing agent solution which contains abrasives being introduced between the frontside of the semiconductor wafer and the polishing pad during the polishing step.

BRIEF DESCRIPTION OF THE DRAWINGS

FIG. 1 illustrates the improvement in SFQR of partial sites when polishing is performed by one embodiment of the inventive process.

DETAILED DESCRIPTION OF THE PREFERRED EMBODIMENT(S)

The invention is based on the discovery that the process of polishing 450 mm wafers requires a fundamental change. Those polishing methods known in the prior art, which have been taken into consideration for defining the new polishing process, have been discussed previously. They essentially involve modifications of the conventionally used methods of double-sided polishing (DSP) and chemical-mechanical polishing (CMP), which in one case comprise polishing both sides of a semiconductor wafer by means of a polishing pad while supplying a polishing agent as stock polishing (DSP step) and in the other case finish polishing of only the frontside (the "component side") while using a softer polishing pad as so-called haze-free polishing (CMP step, "finishing"), but also relatively new so-called "fixed abrasive polishing" (FAP) technologies in which the semiconductor wafer is polished on a polishing pad but the latter contains an abrasive fixed in the polishing pad ("fixed-abrasive pad"). A polishing step, in which such an FAP pad is used, will be referred to below as an FAP step for brevity.

The expression polishing agent will be used below as an umbrella term for polishing agent suspensions and polishing agent solutions.

The invention thus relates to a method for polishing both sides of a semiconductor wafer, comprising the following steps in the order specified:

a) polishing of a backside of the semiconductor wafer on a polishing pad which contains an abrasive fixed in the polishing pad, a polishing agent solution which is free of solids being introduced between the backside of the semiconductor wafer and the polishing pad during the polishing step;

b) stock polishing of the frontside of the semiconductor wafer on a polishing pad which contains an abrasive fixed in the polishing pad, a polishing agent solution which is free of solids being introduced between the frontside of the semiconductor wafer and the polishing pad during the polishing step;

c) removal of the microroughness and microdamage from the frontside of the semiconductor wafer by polishing the frontside of the semiconductor wafer on a polishing pad, a polishing agent solution which contains abrasives being introduced between the frontside of the semiconductor wafer and the polishing pad during the polishing step;

d) finish polishing of the frontside of the semiconductor wafer by polishing the frontside of the semiconductor wafer on a polishing pad which contains no abrasive fixed in the polishing pad, a polishing agent solution which contains abrasives being introduced between the frontside of the semiconductor wafer and the polishing pad during the polishing step.

The Inventor has discovered that only sequential polishing of the front- and backside of semiconductor wafers is suitable. The hitherto used batch polishing methods which simultaneously polish a plurality of semiconductor wafers, on both sides held on carrier discs, are entirely insufficient, and need to be replaced by single-disc processing.

This single-disc processing of the front- and backside of the semiconductor wafer takes place sequentially according to the invention and preferably on the same polishing machine, and it comprises both polishing steps which correspond to stock polishing (as in conventional DSP) and polishing steps which correspond to haze-free polishing (as in conventional CMP).

The processing of the backside takes place either on a second polishing machine or on the same one as used for processing the frontside of the semiconductor wafer, the latter variant offering the advantage of making do with much less polishing equipment than previously in conventional sequences which always contain a DSP step and a CMP step, especially because polishing machines for single-disc processing are much smaller than the currently used large batch types and also have a much smaller space requirement, and therefore entail entirely new fabrication plant planning with forward-looking restructuring of the fabrication lines. In order for the variant with the second polishing machine, required for processing the wafer backside, to be configured more effectively, it is conceivable to equip a polishing machine for example of the Reflection type from Applied Materials with fixed abrasive polishing pads on all 3 polishing plates, and subsequently to carry out backside polishing of the wafers. In a subsequent step, the already backside-polished wafers are polished on the frontside on another polishing machine of the same type, for example lot by lot, in which case the polishing steps described under points b) to d) are employed sequentially.

The concomitant simplifications of the fabrication sequences furthermore allow additional cost savings.

The present invention makes it possible to achieve an improvement in the edge geometry of the polished semiconductor wafer by improving the edge roll-off, in particular by improving the partial sites. With respect to the nanotopology or nanotopography, values are achieved which already satisfy the 22 nm design rule requirements. This is possible because the two sides of the semiconductor wafer can be adapted to one another in a controlled way owing to the sequential polishing, for example in order to positively influence the geometry in the edge region.

The method according to the invention is not disclosed in the prior art. For example, the method described in US 2002/00609967 A1 requires exactly the opposite sequence with respect to the FAP steps on the frontside (cf. steps b) and c) of the method according to the invention). This publication, directs the person skilled in the art away from the present invention. With respect to WO 03/074228 A1, it should be emphasized that the method described therein deals exclusively with the polishing of copper, and it is regarded as unimportant therein whether the polishing agent contains or does not contain free abrasive particles in the first polishing step.

In the simplest case, the polishing agent solution according to steps a) and b) of the present invention is water, preferably deionized water (DIW) with the usual purity for use in the semiconductor industry. The polishing agent solution may however also contain compounds such as sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH) or any mixtures thereof. The use of potassium carbonate is more particularly preferred. In this case, the pH of the polishing agent solution preferably lies in a range of from 10 to 12 and the proportion of the aforementioned compounds in the polishing agent solution is preferably from 0.01 to 10% by weight, more preferably from 0.01 to 0.2% by weight.

The polishing agent solution may furthermore contain one or more further additives, for example surface-active additives such as wetting agents and surfactants, stabilizers acting as protective colloids, preservatives, biocides, alcohols and sequestrants.

Between steps b) and c), a further FAP step is preferably carried out by using a polishing agent suspension as in step c), but with an FAP pad.

The proportion of the abrasive in the polishing agent suspension according to steps c) and d) of the method according to the invention is preferably from 0.25 to 20% by weight, more preferably from 0.25 to 1% by weight. The size distribution of the abrasive particles is preferably monomodal, and the average particle size is preferably from 5 to 300 nm, more preferably from 5 to 50 nm.

The abrasive consists of a material which mechanically removes substrate material, preferably one or more of the oxides of the elements aluminum, cerium or silicon. A polishing agent suspension which contains colloidally disperse silica is particularly preferred (silica sol, cf. Table 1 and the associated description; "Glanzox").

The pH of the polishing agent suspension preferably lies in a range of from 9 to 11.5, and is preferably adjusted by additives such as sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH) or any mixtures of these compounds. The use of potassium carbonate is particularly preferred. The polishing agent solution may furthermore contain one or more further additives, for example surface-active additives such as wetting agents and surfactants, stabilizers acting as protective colloids, preservatives, biocides, alcohols and sequestrants.

As substrates which can be polished according to the invention, in particular semiconductor wafers made of materials such as silicon, gallium arsenide, $Si_xGe_{1-x}$, sapphire and silicon carbide may be envisaged.

Particularly suitable substrates are semiconductor wafers made of silicon and substrates derived therefrom. The silicon semiconductor wafer frontside to be polished may be in a state as it is obtained after slicing the semiconductor wafer from a crystal, after lapping the semiconductor wafer, after grinding the semiconductor wafer, after etching the semiconductor wafer or after the semiconductor wafer has already been polished.

A bare substrate which is derived from a silicon semiconductor wafer, is intended to mean in particular substrates with a layer structure, for example semiconductor wafers with a layer deposited by means of epitaxy, SOI substrates ("Silicon On Insulator") and sSOI substrates (Strained Silicon On Insulator) and corresponding intermediate products (for example SGOI="Silicon-Germanium On Insulator") thereof.

The intermediate products also include donor semiconductor wafers, from which layers are transferred onto other substrates, particularly in the course of producing SOI substrates. In order for it to be reusable, it is necessary to smooth the donor semiconductor wafer's surface exposed by the layer transfer, which is comparatively rough and has a characteristic step in the edge region.

The substrate surfaces to be polished need not consist of silicon, or only of silicon. They may, for example, be layers consisting of a III-V compound semiconductor such as gallium arsenide or an alloy of silicon and germanium ($Si_x Ge_{1-x}$). Other examples are layers of indium phosphide, gallium nitride and aluminum-gallium arsenide. Such layers are currently of great interest in particular for the production of "Light Emitting Diodes" (=LEDs).

The surface of $Si_x Ge_{1-x}$ layers is often characterized by a pattern, known as "cross hatch" and caused by dislocations, and as a rule it must be smoothed before one or more further layers can be deposited on it. If substrates having layers of germanium or $Si_x Ge_{1-x}$ are to be polished according to the invention, then the polishing agent suspension or the polishing agent solution, or both, may contain an oxidizing agent as a further additive. Suitable oxidizing agents are hydrogen peroxide ($H_2O_2$) and ozone ($O_3$). Their addition converts germanium into a water-soluble compound. Without their addition, particles that contain germanium may be formed in the course of the polishing, which can scratch the polished surface.

Substrates with a large diameter, for example silicon semiconductor wafers with a diameter of 300 mm or in particular with a diameter of 450 mm, are polished individually according to the invention. The separate polishing steps (at least 4 according to steps a), b), c) and d) of the method according to the invention) are carried out sequentially on both the front- and the backside.

The invention does not relate to simultaneous polishing of the front- and the backside at the same time (DSP). According to the invention, only one side of the semiconductor wafer is respectively processed in each processing step.

Essentially the semiconductor wafer surface to be polished is pressed, with the aid of a "polishing head", against a polishing pad placed on a polishing plate. A polishing head also possesses a "retainer ring", which encloses the substrate laterally and prevents it from sliding off the polishing head during polishing. In modern polishing heads, the semiconductor wafer's side surface facing away from the polishing pad bears on a resilient membrane which transmits the polishing pressure being exerted. The membrane is a component of an optionally subdivided chamber system, which forms a gas or liquid cushion.

Nevertheless, there are polishing heads in use in which a resilient backing ("backing pad") is used instead of the membrane. This resilient backing is generally applied on a solidly manufactured plate ("backing plate"). Between the backing pad and the wafer backside, an air cushion may then optionally be generated over various zones on the wafer backside. Furthermore, there are also polishing heads in use in which the wafer is polished with the aid of a so-called "template", i.e. by means of a backing plate and a retainer ring which is applied on a resilient backing ("backing pad"). The retainer ring, which has a defined thickness, is used so that the wafer maintains its position in the carrier during the polishing. The thickness of this retainer ring may be selected so that it is either thicker than the wafer per se—which is described as a so-called "recessed wafer"—or thinner, in which case the term "projecting wafer" is used.

The polishing of the substrate is carried out while supplying a polishing agent between the substrate and the polishing pad and by rotating the polishing head and the polishing plate. In addition, the polishing head may also be moved in translation over the polishing pad so that more comprehensive use of the polishing pad surface is achieved.

The method according to the invention may be carried out equally well on single-plate and multi-plate polishing machines. It is preferable to use multi-plate polishing machines with preferably two, more preferably three, polishing plates and polishing heads. Different polishing pads and different polishing agents may also be employed.

In the method according to the invention, a polishing pad that contains an abrasive fixed in the polishing pad is respectively used in steps a) and b) (FAP or FA pad). Suitable abrasives comprise, for example, particles of oxides of the elements cerium, aluminum, silicon or zirconium and particles of hard substances such as silicon carbide, boron nitride and diamond.

Particularly suitable polishing pads have a surface topography imposed by replicated microstructures. These microstructures ("posts") have, for example, the shape of columns with a cylindrical or polygonal cross section or the shape of pyramids or pyramid frustums.

Such polishing pads are commercially available, and are provided for example by 3M Corp., USA (for example "ESP 001" from 3M). More detailed descriptions of such polishing pads are contained, for example, in WO 92/13680 A1 and US 2005/227590 A1.

In step c), a stock polishing pad is preferably used. A polishing pad of the SUBA™ range from Rohm & Haas is, suitable, for example SUBA™ 1250 ("stock pad") or a typical CMP polishing pad ("finishing pad") such as SPM 3100 from Rodel®. It may however also be an FAP polishing pad as in step b) of the method according to the invention, i.e. a polishing pad which contains fixed abrasive unlike stock and CMP polishing pads.

Processing steps b) and c) may thus involve the same polishing pad, or different polishing pads may be used. In step c), for instance, an FAP polishing pad may be used. It is, however, also preferable to use a CMP polishing pad.

A CMP polishing pad is used in step d), for example SPM 3100 from Rodel® which contains no fixed abrasive. Step d) corresponds to a conventional CMP polishing step. The CMP polishing pad may be conditioned by means of standard pad conditioning, for example, diamond dressers from KINIC.

Example

An FAP pad from 3M Corp., USA, was used for this exemplary embodiment, with abrasive particles fixed therein made of cerium oxide ($CeO_2$) with an average grain size of 0.55 μm ("ESP 001"). Table 1 shows an example of the process sequence for frontside polishing with all the important parameters. A multi-plate polishing machine was used for the tests (AMAT Reflection from Applied Materials, Inc.).

The polishing machine comprises a 5-zone membrane carrier, which allows the pressure profile of the carrier to be set differently in 5 zones.

The process parameters specified in Table 1 are familiar to those skilled in the art of wafer polishing, so that a detailed explanation may be omitted. The majority of parameters are well known in the art, and optimization of those parameters (pressure, speeds) lie within the ability of a person skilled in the art. The essence of the invention consists in the processing sequence and the polishing pads respectively used for this (FAP or CMP, fixed abrasive: yes/no) and the polishing agents (solution, suspension).

A stock polishing step was initially carried out on plate 1 by using an FA polishing pad and a polishing agent solution (potassium carbonate $K_2CO_3$). A smoothing step was subsequently carried out on the same polishing plate, likewise with an FAP pad but by using a polishing agent suspension. Steps 3 and 4 on plate 2 and plate 3 correspond to conventional CMP steps.

TABLE 1

| | Polishing Plate | | | |
|---|---|---|---|---|
| | Plate 1 | Plate 2 | | Plate 3 |
| | Step sequence | | | |
| | Stock (step 1) | Smoothing (step 2) | Smoothing (step 3) | Smoothing (step 4) |
| Pressure profile of the membrane carrier Zone 1-5 [psi] | 4.1/3.2/3.4/ 4.0/4.0 | 4.1/3.2/ 3.4/4.0/ 4.0 | 4.1/3.2/ 3.4/4.0/ 4.0 | 4.1/3.2/ 3.4/4.0/ 4.0 |
| Retainer ring application pressure [psi] | 7.5 | 7.5 | 7.5 | 7.5 |
| Agent | $K_2CO_3$ 0.2 wt. % | Glanzox 3900*) 0.8 wt. % | Glanzox 3900*) 0.8 wt. % | Glanzox 3900*) 0.8 wt. % |
| Flow rate [l/min] | 0.5 | 0.5 | 0.5 | 0.5 |
| Polishing times [s] | 33 | 127 | 160 | 160 |
| Plate/head speed [rpm]/[rpm] | 119/123 | 119/123 | 119/123 | 119/123 |
| Type of pad conditioning | — | — | in situ | in situ |
| Application pressure of the pad conditioning unit [lb] | — | — | 4 | 4 |
| Pad conditioning speed [rpm] | — | — | 100 | 100 |
| Polishing pad | FAP pad 0.55 μm | FAP pad 0.55 μm | CMP pad SPM 3100 | CMP pad SPM 3100 |

*)Glanzox 3900 is the product name of a polishing agent suspension which is available as a concentrate from Fujimi Incorporated, Japan. The concentrate, with a pH of 10.5, contains about 9% by weight of colloidal $SiO_2$ with an average particle size of from 30 to 40 nm. The $SiO_2$ content indicated in Table 1 is expressed in terms of the polishing agent.

The Nanomapper® instrument from KLA Tencor was used to study the nanotopography. This interferometer is suitable for measuring topography in the range of between −20 nm and +20 nm on the frontside of a semiconductor wafer. During the measurement, the semiconductor wafer is placed on a soft flat wafer holder (chuck). The peak-to-valley (PV) values obtained are filtered (Gaussian high-pass filter) and analyzed on circles with a 2 mm diameter (in addition, also on circles with a 10 mm diameter) with respect to peak-to-valley deviations. For the THA analysis ("threshold height analysis"), see SEMI Standard M43. The 3-sigma PV value was calculated from the distribution of all the PV values, as a so-called THA value.

The wafers polished according to the invention gave a THA value of 10 nm or better. When using the polishing parameters specified in Table 1, a THA value of 5.1 nm was obtained. The analysis range corresponded to the aforementioned circles with a 2 mm diameter. This THA value is often also referred to as the THA-2 value, in order to make it clear that small analysis windows of 2 mm diameter were employed. Further improvements in this parameter are to be expected from optimization of the polishing process.

A semiconductor wafer polished according to the invention thus has a nanotopography, expressed as THA-2, of from 1 to 10 nm, preferably of from 1 to 5 nm.

The improvement in the edge geometry by improving the local planarity of the so-called "partial sites" will be explained with the aid of FIG. 1. FIG. 1 shows the distribution (frequency) with which particular SFQR values occur in the partial sites, on the one hand for a wafer before carrying out the method according to the invention and in the other case after the wafer has been polished according to the invention.

A DSP-polished wafer of monocrystalline silicon with a diameter of 300 mm was studied. In order to establish the effect of the method according to the invention on the edge geometry, the same wafer was subjected to corresponding polishing of the frontside, for which the following parameters were employed (cf. step sequences in Table 1):

plate 1 with FAP pad: step 1: 33 sec only $K_2CO_3$ solution (0.2% by weight); subsequently step 2: 8 sec Glanzox (silica sol).

plates 2 and 3 with haze-free polishing pad (CMP "SPM 3100") and exclusively Glanzox as polishing agent; in each case 43 sec.

A significant improvement by about 0.01 μm is found over the entire distribution. The $SFQR_{max}$ of the partial sites is also improved by about this amount. The method according to the invention is therefore suitable for improving the local geometry in the edge region.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A sequential method for polishing both sides of a bare semiconductor wafer having a frontside and backside, comprising the following steps in the order specified:
   a) single side polishing the backside of the semiconductor wafer on a polishing pad which contains an abrasive fixed in the polishing pad, a polishing agent solution which is free of solids being introduced between the backside of the semiconductor wafer and the polishing pad during the polishing step;
   b) single side stock polishing the frontside of the semiconductor wafer on a polishing pad which contains an abrasive fixed in the polishing pad, a polishing agent solution which is free of solids being introduced between the frontside of the semiconductor wafer and the polishing pad during the polishing step;
   c) removing microroughness and microdamage from the frontside of the semiconductor wafer by single side polishing the frontside of the semiconductor wafer on a polishing pad, a polishing agent suspension which contains abrasives being introduced between the frontside of the semiconductor wafer and the polishing pad during the polishing step;
   d) finish polishing the frontside of the semiconductor wafer by single side polishing the frontside of the semiconductor wafer on a polishing pad which contains no abrasive fixed in the polishing pad, a polishing agent suspension which contains abrasives being introduced between the frontside of the semiconductor wafer and the polishing pad during the polishing step,
   further comprising carrying out a further polishing step between steps b) and c) on a polishing pad which contains an abrasive fixed in the polishing pad, and a polishing agent suspension which contains abrasives is introduced between the frontside of the semiconductor wafer and the polishing pad during the polishing step.

2. The method of claim 1, wherein the polishing agent solution of steps a) and b) is water, or an aqueous solution containing the compounds sodium carbonate ($Na_2CO_3$), potassium carbonate ($K_2CO_3$), sodium hydroxide (NaOH), potassium hydroxide (KOH), ammonium hydroxide (NH$_4$OH), or tetramethylammonium hydroxide (TMAH) or any mixtures thereof.

3. The method of claim 2, wherein the pH of the polishing agent solution is from 10 to 12 and the total proportion of the compounds in the polishing agent solution is from 0.01 to 10% by weight.

4. The method of claim 1, wherein the proportion of the abrasive in the polishing agent suspension in steps c) and d) is from 0.25 to 20% by weight.

5. The method of claim 1, wherein the proportion of the abrasive in the polishing agent suspension in steps c) and d) is preferably from 0.25 to 1% by weight.

6. The method of claim 5, wherein the average particle size of the abrasive is from 5 to 300 nm.

7. The method of claim 6, wherein the average particle size of the abrasive is from 5 to 50 nm.

8. The method of claim 1, wherein the abrasive in the polishing agent suspension consists of one or more of the oxides of the elements aluminum, cerium, or silicon.

9. The method of claim 8, wherein the polishing agent suspension contains colloidal silica.

10. The method of claim 1, wherein the pH of the polishing agent suspension is in the range of from about 9 to about 11.5.

11. The method of claim 1, wherein the pH of the polishing agent suspension is adjusted by additives of sodium carbonate (Na$_2$CO$_3$), potassium carbonate (K$_2$CO$_3$), sodium hydroxide (NaOH), potassium hydroxide (KOH), ammonium hydroxide (NH4OH), or tetramethylammonium hydroxide (TMAH), or any mixtures of these compounds.

12. The method of claim 1, wherein the polishing pads used in steps a) and b) contain abrasive particles of oxides of the elements cerium, aluminum, silicon or zirconium or particles of silicon nitride, boron nitride or diamond, or mixtures thereof.

13. The method of claim 1, wherein a polishing pad which contains no fixed abrasives is used in step c).

14. The method of claim 1, wherein a polishing pad which contains fixed abrasive is used in step c).

15. The method of claim 14, wherein the polishing pad used in step c) contains abrasive particles of oxides of the elements cerium, aluminum, silicon or zirconium or particles of silicon nitride, boron nitride or diamond, or mixtures thereof.

16. The method of claim 1, wherein the semiconductor wafer is a silicon wafer with a diameter of 300 mm or more.

* * * * *